(12) United States Patent
Lu

(10) Patent No.: US 12,181,968 B2
(45) Date of Patent: Dec. 31, 2024

(54) SYSTEM AND METHOD OF REDUCING LOGIC FOR MULTI-BIT ERROR CORRECTING CODES

(71) Applicant: TAIWAN SEMICONDUCTOR MANUFACTURING COMPANY LTD., Hsinchu (TW)

(72) Inventor: Shih-Lien Linus Lu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/350,776

(22) Filed: Jul. 12, 2023

(65) Prior Publication Data
US 2023/0367673 A1    Nov. 16, 2023

Related U.S. Application Data

(63) Continuation of application No. 17/193,363, filed on Mar. 5, 2021, now Pat. No. 11,748,192, which is a
(Continued)

(51) Int. Cl.
*G06F 11/10* (2006.01)
*G11C 29/04* (2006.01)
(Continued)

(52) U.S. Cl.
CPC ...... *G06F 11/1068* (2013.01); *G06F 11/1048* (2013.01); *G11C 29/42* (2013.01);
(Continued)

(58) Field of Classification Search
CPC .. G06F 11/1068; G06F 11/1048; G11C 29/42; G11C 29/52; G11C 2029/0411;
(Continued)

(56) References Cited

U.S. PATENT DOCUMENTS

| 5,781,568 A | * | 7/1998 | Hsieh | H03M 13/15 714/766 |
| 6,675,349 B1 | * | 1/2004 | Chen | H03M 13/11 714/758 |

(Continued)

FOREIGN PATENT DOCUMENTS

CN        103392206 A    11/2023

OTHER PUBLICATIONS

U.S. Pat. No. 8,099,652 is the US counterpart of CN 103392206 A.

*Primary Examiner* — John J Tabone, Jr.
(74) *Attorney, Agent, or Firm* — WPAT LAW; Anthony King

(57) ABSTRACT

A method of generating an error correction circuit for correcting an error in a codeword read from a memory includes: constructing a generation matrix (G matrix) formed of a concatenation of a parity matrix (P matrix) and an identity matrix; determining a number of rows in the P matrix for a truncated P matrix in view of a correcting strength and a number of data bits; selecting a first subset of rows and a second subset of rows in the P matrix, wherein a first sum of row weights of each row in the first subset of rows is equal to or less than a second sum of row weights of each row in the second subset of rows; and generating the truncated P matrix by keeping the first subset of rows of the P matrix so as to minimize a number of logic gate operations.

20 Claims, 9 Drawing Sheets

Related U.S. Application Data continuation of application No. 16/285,677, filed on Feb. 26, 2019, now Pat. No. 10,949,298.

(60) Provisional application No. 62/734,468, filed on Sep. 21, 2018.

(51) Int. Cl.
    *G11C 29/42* (2006.01)
    *G11C 29/52* (2006.01)
    *H03M 13/00* (2006.01)
    *H03M 13/15* (2006.01)

(52) U.S. Cl.
    CPC ............ *G11C 29/52* (2013.01); *H03M 13/152* (2013.01); *H03M 13/1575* (2013.01); *H03M 13/616* (2013.01); *H03M 13/6502* (2013.01); *G11C 2029/0411* (2013.01)

(58) Field of Classification Search
    CPC ........... H03M 13/152; H03M 13/1575; H03M 13/616; H03M 13/6502

USPC ................ 714/764, 768, 773, 782, 785, 799
    See application file for complete search history.

(56) References Cited

U.S. PATENT DOCUMENTS

| | | | |
|---|---|---|---|
| 10,949,298 B2* | 3/2021 | Lu ..................... | H03M 13/6502 |
| 11,748,192 B2* | 9/2023 | Lu ..................... | H03M 13/616 |
| | | | 714/764 |
| 2003/0131310 A1* | 7/2003 | Pitio ................. | H03M 13/2906 |
| | | | 714/E11.034 |
| 2004/0168112 A1* | 8/2004 | Kim ..................... | H03M 13/11 |
| | | | 714/752 |
| 2005/0149845 A1* | 7/2005 | Shin .................. | H03M 13/6516 |
| | | | 714/801 |
| 2006/0020873 A1* | 1/2006 | Deolalikar ............ | H03M 13/17 |
| | | | 714/777 |
| 2023/0367673 A1* | 11/2023 | Lu ..................... | H03M 13/616 |

* cited by examiner $$g(x) = g_0 + g_1 x + g_2 x^2 + \ldots + g_{n-k} x^{n-k}$$

FIG. 2

SYSTEM AND METHOD OF REDUCING LOGIC FOR MULTI-BIT ERROR CORRECTING CODES

PRIORITY CLAIM AND CROSS-REFERENCE

This application claims the benefit of U.S. Provisional Application No. 62/734,468, filed on Sep. 21, 2018 and is a continuation application of U.S. non-provisional patent application Ser. No. 17/193,363 filed Mar. 5, 2021, which is a continuation application of U.S. patent application Ser. No. 16/285,677 filed Feb. 26, 2019, now U.S. Pat. No. 10,949,298 B2, the disclosures of which are hereby incorporated by reference in its entirety.

BACKGROUND

Error Correction Codes (ECCs) are used in many applications. One of the popular applications is to detect and correct bit-errors in memory. With aggressive technology scaling, lowering of supply voltage and development of emerging memory technologies such as magnetoresistive random access memory (MRAM) and resistive RAM (ReRAM), there is a resurgent interest in efficient implementation of ECC logic.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a diagram of an exemplary generation matrix (G matrix) in non-systematic form.

DETAILED DESCRIPTION

Figure 1:
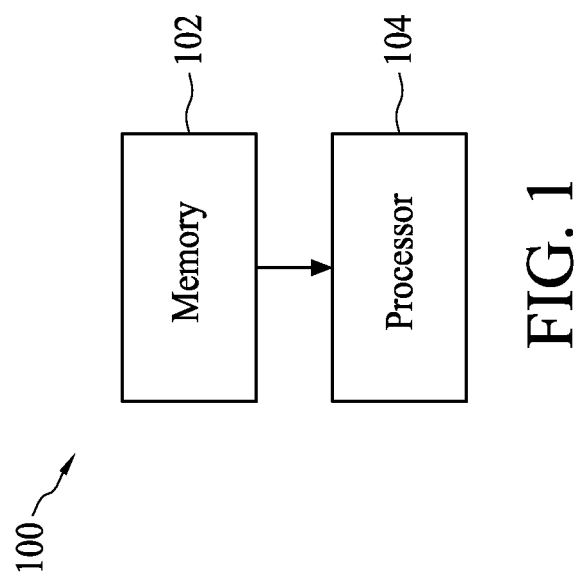
FIG. 1 is a diagram illustrating a memory system having the BCH codes scheme in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure in various embodiments provides a method of reducing logic required for implementing multi-bit error-correcting codes by using systematic check matrix. Also, the present disclosure provides a method of locating error bits in a multi-bit code.

Error-correcting code (ECC) is used in many places. One of the applications of ECC is to detect and correct errors in semiconductor memory. A general scheme of using ECC to protect memory is by adding redundant check bits to the data bits of the semiconductor memory. These extra check bits extend the distance between two valid codewords. For example, the distance may be the bit number between the valid codeword and the invalid codeword. A common set of ECCs used extensively is called the Bose—Chaudhuri—Hocquenghem (BCH) codes. BCH codes, used extensively in modern memory, are a class of cyclic error-correcting codes constructed using polynomials over a finite field (Galois Field). An advantage of BCH codes is that during code design, there is a precise control over the number of symbol errors correctable by the code. The symbol may be a data block with a predetermined bit number or size. In particular, it is possible to design binary BCH codes that can correct multiple bit errors. Another advantage of BCH codes is the ease with which they can be decoded, namely, via an algebraic method known as syndrome decoding. This simplifies the design of the decoder using hardware. With BCH codes, the generation of check bits and syndrome bits can be represented by using the "Generation Matrix" (G matrix) and "Check Matrix" (H matrix), which are constructed using the polynomials for the code designed.

FIG. 1 is a diagram illustrating a memory system 100 having the BCH codes scheme in accordance with some embodiments. The memory system 100 comprises a memory 102 and an error correction circuit (or a processor) 104. The memory 102 is arranged to store codewords encoded by the BCH codes. The error correction circuit 104, which may be a decoder or an encoder, is coupled to the memory 102 for correcting at least one error in a codeword read from the memory. The codewords may be read out from the memory 102 by a controller coupled to the memory 102 and the error correction circuit 104. For brevity, the controller is not shown in FIG. 1. According to some embodiments, the error correction circuit 104 is implemented or formed according to the following operations: constructing a generation matrix (G matrix); transforming the G matrix into a systematic form, the transformed G matrix composed of a parity matrix (P matrix) and a check matrix (H matrix); sorting rows of the P matrix according to row weights; determining the number of rows in the P matrix to be truncated in view of a correcting strength and the number of data bits; generating a truncated P matrix by truncating the sorted rows of the P matrix that have a first row weights and keeping the sorted rows of the P matrix that have a second row weights; and forming the error correction circuit 104 according to the truncated P matrix. According to some embodiments, the error correction circuit 104 generates a syndrome according to the codeword; and determines the error according to the syndrome. According to some embodiments, the first row weights are greater than the second row weights. By using the above operations to form the error correction circuit 104, the number of logic gates in the error correction circuit 104 may be reduced. The detailed operations of the error correction circuit is described in the following paragraphs.

Figure 2:
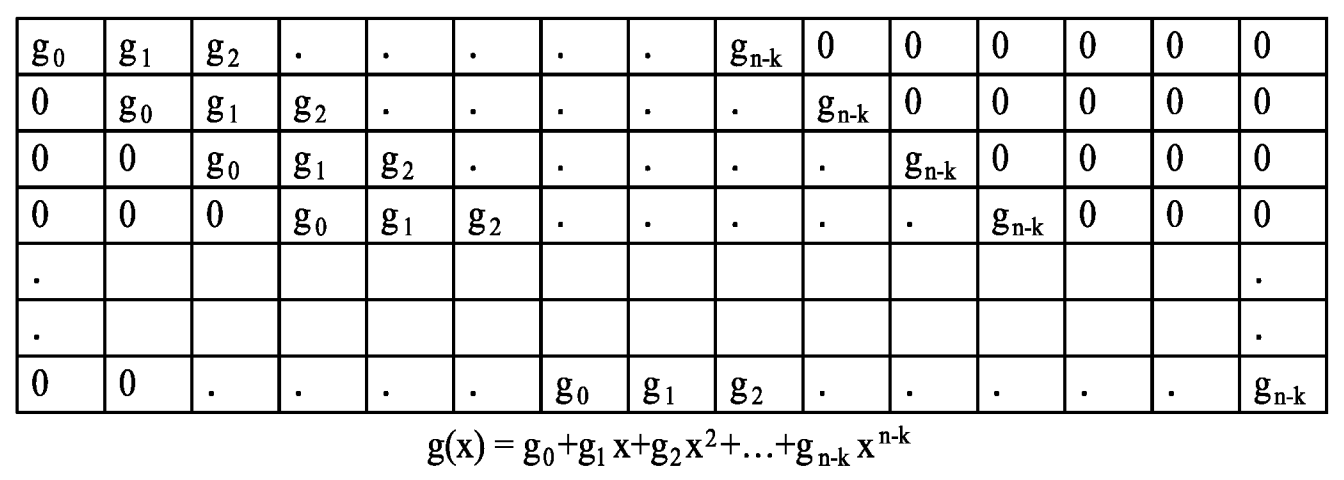

For simplicity, binary BCH codes are discussed as an example in the present disclosure. Given an integer m, m is greater or equal to 3, there exists a binary BCH code having a length $2^m-1$. For this BCH code to correct t bit errors (called t-bit error-correcting BCH code), the minimum distance between valid code-words is at least 2t+1. Therefore n−k, the number of check bits, must be greater than or equal to (m+1)*t, where k is the number of data bits and n is the codeword length. As mentioned BCH is a special kind of cyclic codes based on polynomials in the Galois Field (GF). Theses codes can be constructed using primitive polynomials in $GF(2^m)$. Let α be a primitive element in $GF(2^m)$, the generator polynomial g(x) of a t-bit error correcting BCH code of length $2^m-1$ is the lowest-degree polynomial over GF(2) which has α, $α^2$, $α^3$, . . . , $α^{2t}$ as its roots. Let φi(X) be the minimal polynomial of α, then g(x)=LCM{$φ_i(X)$, $φ_3(X)$, $φ_5(X)$, . . . , $φ_{2t}-1(X)$}. The generation function can be expressed in matrix form (and called "the G matrix"). Check bits are the dot product of an input vector with the G matrix. FIG. 2 illustrates an exemplary generation matrix (G matrix) in non-systematic form. According to some embodiments, the G matrix has k rows and n column, and the row may be the cyclic shifts of the basic vector g=[$g_0 g_1 g_2$ . . . $g_{n-k-1} g_{n-k}$ 00 . . . 0] of the G matrix. The elements in the basic vector g may consist of the coefficients of the generator polynomial g(x) as illustrated in FIG. 2.

Figure 3:
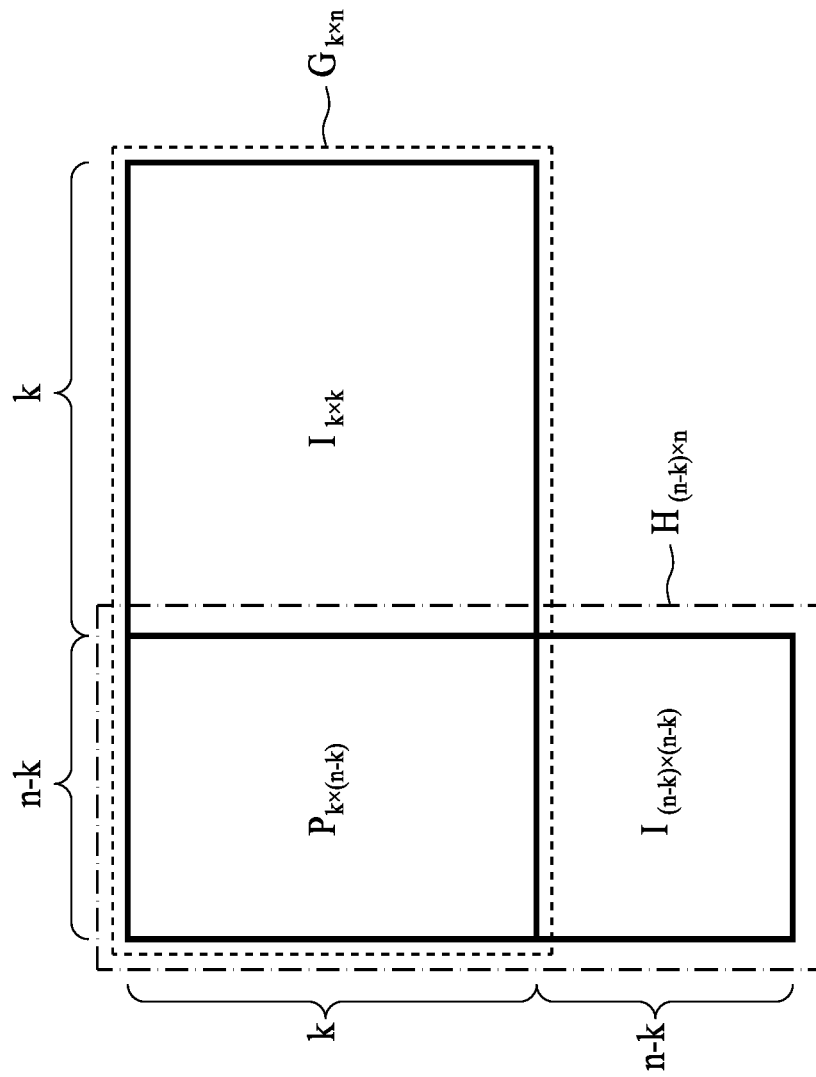
FIG. 3 is a diagram showing relationship of a G matrix and a check matrix (H matrix) in systematic form.

By performing linear transformations to G matrix, a new G matrix in systematic form is obtained. FIG. 3 is a diagram showing relationship of a generation matrix (G matrix) and a check matrix (H matrix) in systematic form. FIG. 3 shows the H transport. In the present embodiment, the G matrix is composed of the P matrix of a dimension k by (n−k) and an identity matrix of a dimension k by k, where n is the size of a code word and k is the size of a data word. As a result, the G matrix has a dimension of k by n, denoted as $G_{k \times n}$.

The check bits are generated in accordance with an equation below:

$c = m \cdot P$ where c and m in italic form represent a bit vector of check bits and data bits, respectively, and the symbol "•" represents a dot operation.

The codeword is the concatenation of the data bits m and the check bits c. When the G matrix is transformed into systematic form, the H matrix, which is basically the transpose of P matrix concatenated with another identity matrix, can be obtained. As shown in FIG. 3, the data bits and check bits are separated from each other. In the present embodiment, the H matrix is obtained by taking the transpose of P matrix and concatenating the transposed P matrix with an identity matrix of a dimension (n−k) by (n−k), resulting in $H_{(n-k) \times n}$ FIG. 3 shows $H^T$ which is of n×(n−k).

Further, to detect if a retrieved data r is a valid code word, a syndrome S is generated by using the H matrix in accordance with an equation below.

$S = r \cdot H^T$ where $H^T$ represents a transpose of the H matrix.

Error correction code (ECC) bases on information redundancy to detect and correct bit errors. For a k-bit data the number of check bits, x, (redundant bits) required to correct each error bit needs to satisfy:

$x \geq \text{ceiling}[\log_2(k+x+1)]$

This equation comes about because given x bits one can encode $2^x$ different information indicating which location the bit is of error. The extra (+1) bit is there to indicate there is no error. For example, if there are 128b data, 8 check bits (x=8) may be required to correct each bit of error because $\log_2(128+8+1)<8$. If x=7, the equation ceiling[$\log_2(128+7+1)$] is 8 and it is greater than 7. The inequality is not satisfied. To satisfy the inequality, x may be equal to 8. Therefore, for example, to correct 2 bits of error (t=2), 16 bits of check bits may be required for 128 bits of data.

As shown in FIG. 3, when G matrix is in systematic form, it shares a parity matrix (P matrix) with the H matrix. It is advantageous to share the P matrix between G and H matrices in that only a single circuit needs to be designed for check bit generation and syndrome generation.

Normally in computing systems the data size is usually a power of 2 (for example 32, 64, 128 etc.). In some embodiments, the maximum code word size with a given check bit size is not a power of 2 (it is $2^m-1$, for example 31, 63, 127 etc.). As a result, a "truncated" code word is usually used (for example a code word of 63 to protect data width of 32). The truncated code word may be obtained by picking columns out of the H matrix. For example, if the data size is 128 bits (128b) with 2 bits of correction strength, the number of check bits is 16. Accordingly, the resultant code word is 144b (=128b+16b) after truncation. Therefore, a code word of 255b is taken and then truncated to the resultant 144b code word.

As previously discussed, check bits c are generated by a "dot" operation of a data bit vector m and a P matrix, and syndrome bits S are generated by a "dot" operation of a retrieved bit vector r and an $H^T$ matrix. A dot product in matrix operation is obtained by arithmetic multiplication and addition. In GF(2) multiply is equivalent to the logic AND function and add is equivalent to the logic XOR function. Therefore if an entry of a P matrix (H matrix the same) is 0, the result of "multiply" is 0 as well and need not be "added". According to some embodiments, the number of XOR gates needed for generating check bits or syndrome bits is directly proportion to the number of 1's in the P matrix. To reduce the number of XOR gates, the rows (or columns) with relatively large number of 1's in the P matrix may be truncated. Specifically, when an entry of the truncated P matrix is 1, the operation of an XOR gate is enabled. The more number of logic 1 in the P matrix, the more XOR gates should be used in the error correction circuit (or decoder/encoder). Therefore, to minimize the number of XOR gate in the error correction circuit 104, the number of 1's in the P matrix should be minimized. In the truncated P matrix, the number of 1's is minimized by truncating the rows in the P matrix with a greater number of 1's. When the error correction circuit 104 is formed or fabricated according to the truncated P matrix, the number of XOR gates in the error correction circuit 104 may be reduced. Accordingly, the resource of the decoder may be saved during the decoding operation. Accordingly, in truncating a matrix to obtain a truncated code to fit the data width in computing elements, rows (columns) with the smaller number of 1's are selected or retained. An example of this optimization is the Hsiao-Code. Reference of Hsiao-Code can be found, for example, in "A Class of Optimal Minimum Odd-weight-column SEC-DED Codes" by M. Y. Hsiao, IBM Journal of Res. and Develop., vol. 14, no. 4, pp. 395-401 (1970).

The present disclosure in various embodiments provides a method to reduce the number of logic gates needed to implement the matching of syndrome with columns and combination of columns in the H matrix (or rows in the P matrix) for correction (correction is done by locating the position of error bits and then flipping it). The method will be discussed in detail with reference to FIGS. 4 and 6. Due to the large number of combinations of columns in the H matrix, a relatively large number of logic gates may be used to implement the matching of syndrome with the combination of columns in the H matrix. Accordingly, the majority of logic gates or the resource in the decoder are used to implement the matching of syndrome with the combination of columns. For example, a BCH code for 128b data having two-bit correction capability (2-bit ECC strength) uses 16 check bits. The codeword needed to protect 128b data is the (255, 239, 2) code. This code has 16 check bits arriving at 144b of the total number bits for the code word. Since the matrices is systematic form, there will be an identity matrix which is 16×16, and 128 rows out of the 239 remaining rows of the P matrix may be selected. Accordingly, there are C(239, 128) different combinations, which is approximately 2.5E70. This number is too large to have an optimal solution. To optimize the logic gates, in some embodiments, a heuristic algorithm is as follows:

(1) For each row of the P matrix (or each column of the H matrix), the weight of 1's in the row is determined.
(2) The rows are then sorted with ascending weights.
(3) First j rows from the front of the sorted rows are selected, where j is greater than the number of data bits (k). It is likely that j is much larger than k since there will be many rows with the same number weight. For example there may be x rows with the same weight and only a portion of the x rows is selected to meet the data width k.
(4) Select among the last few rows with the same weight (just enough rows to meet k rows) so that these rows have the most overlap with rows in front of this weight. This is approximated by selecting the rows that have the least amount of 1's for all combined rows.

As also previously discussed, to check if a retrieved bit vector r is a valid codeword, syndrome S is generated. In addition, if S is the 0 vector then the resulting codeword is valid. Subsequently, the correct data is obtained by selecting the data field of the codeword. This is one of the advantages of using systematic codeword since the data field and the check field in the systematic codeword are separated. If S is one-hot (only 1 bit is "1") then one of the check bits is in error.

In some embodiments, since each row of the P matrix is independent of each other, the combination of any z columns of the H matrix or any combinations of columns of the H matrix smaller than z are also independent of each other, where z is smaller than or equal to t. Moreover, syndrome S is a result of combining columns where bit(s) is(are) in error. For example, if S matches one of the n-k rows in P (columns in H) then that matched column is in error and a one-bit error is detected. If the resulting syndrome S is equal to the combined columns i and j of the H matrix, then the bits in the locations i and j are in error. A method of determining error location in a memory device will be discussed in detail with reference to FIGS. 7 and 8.

Figure 4:
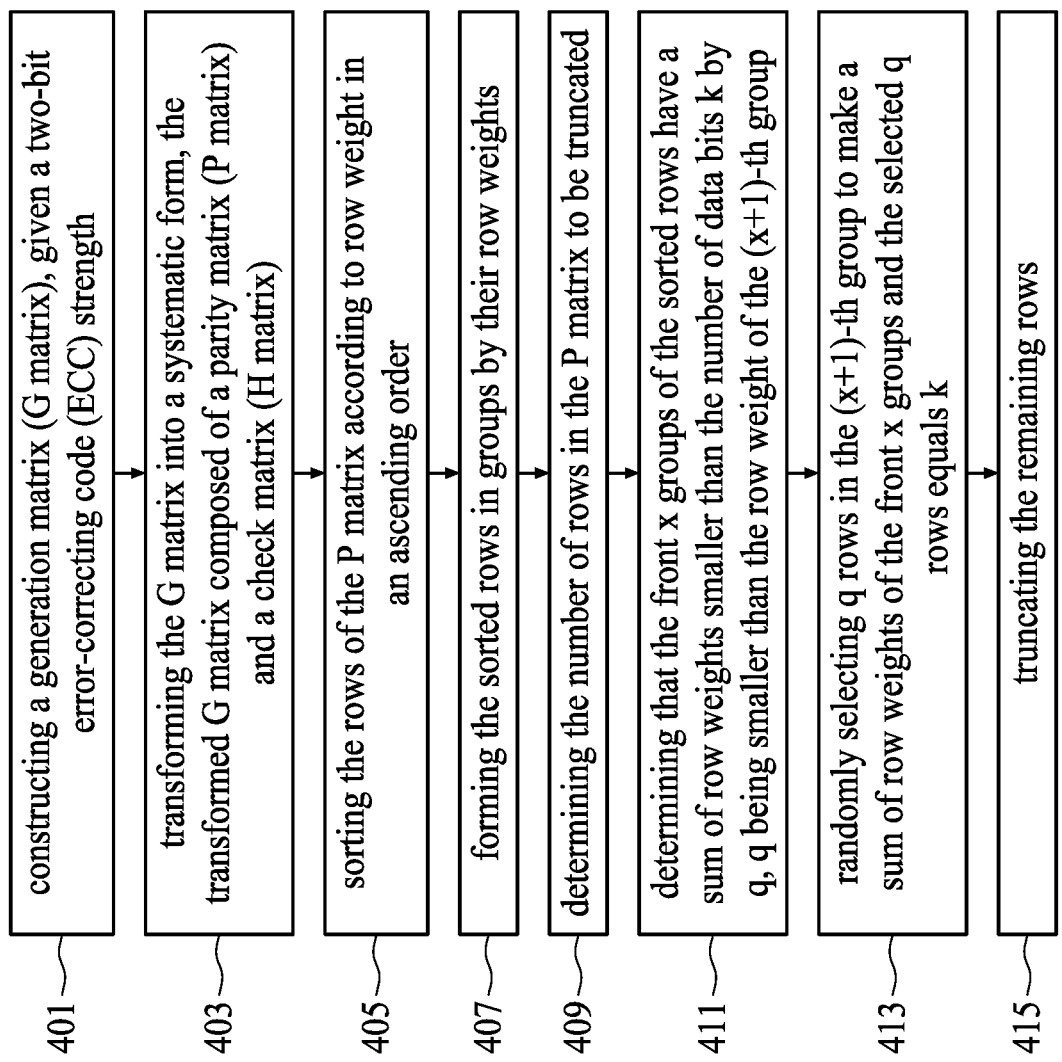
FIG. 4 is a flow diagram showing a method of reducing logic for a memory device with two-bit error-correcting strength, in accordance with some embodiments.

FIG. 4 is a flow diagram showing a method of reducing logic gates of an error correction circuit of a memory device with two-bit error-correcting strength, in accordance with some embodiments. The method may be used to implement or generate the error correction circuit 104 of FIG. 1. An exemplary ECC code below is used to illustrate the proposed optimization method. This example is a 2-bit BCH error correcting code with 128 data bits. In this example the parameters are: m=8, k=128, n=144 and n-k=16. In a vector form $\{g_0, g_1, g_2, \ldots, g_{16}\}$=1101101111011000111, which can express the generation polynomial as $1+x^2+x^3+x^5+x^6+x^7+x^8+x^{10}+x^{11}+x^{15}+x^{16}$.

Figure 5:
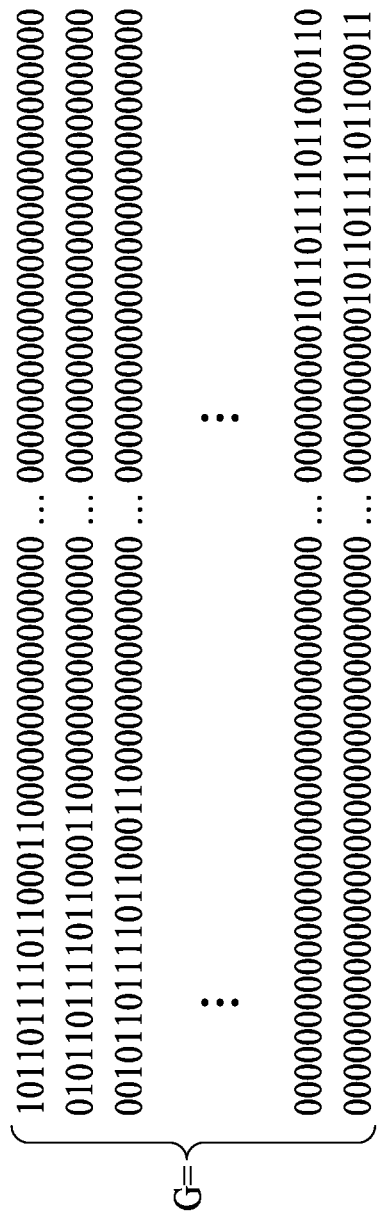
FIG. 5 is a diagram showing a generation matrix in accordance with some embodiments.

Referring to FIG. 4 and FIG. 5, in operation 401 a generation matrix (G matrix), given a two-bit error-correcting code (ECC) strength, is constructed. As shown in FIG. 5, the G matrix is in non-systematic form, and the G matrix may be the cyclic shifts of the basic vector in the G matrix, i.e. the vector form $\{g_0, g_1, g_2, \ldots, g_{16}\}$={10110111101100011}.

In operation 403, the G matrix is transformed into a systematic form. The transformed G matrix is composed of a parity matrix (P matrix) and a check matrix (H matrix), both of which are also in systematic form. According to some embodiments, an operation of linear transformations is performed upon the G matrix to obtain the transformed G matrix in systematic form as illustrated in FIG. 3, for example. As shown in FIG. 2, the G matrix in non-systematic form. The following codes illustrate an example of transforming the G matrix in non-systematic form into systematic form:

```
/* find the systematic form by pivoting */
    for (ii=1; ii < k; ii++) { /* for each row in the P matrix starting from row 1 */
        /* make the rest of the columns jj = 0 */
        if (detect == 0) {
            for (jj=length-k; jj < length-k+ii; jj++) {
                /* make this row an ident vector and go thru all col */
                if (PP[ii][jj] == 1) {
                    /* XOR this iith row with the previous jj-k rows */
                    for (kk=0; kk < length; kk++) {
                        PP[ii][kk] = (PP[ii][kk] + PP[jj-(length-k)][kk]) % 2;
                    }
                }
```

```
        } /* end if */
      } /* end for columns */
    } /* end if detect = 0 */
  } /* done finding the systematic form */
```

Next, in operation 405, when the G matrix in systematic form is obtained, the P matrix may be automatically obtained via the relationship G=[P][I], wherein the matrix [I] is the identity matrix. According to some embodiments, the P matrix is the G matrix without the identity matrix [I]. In the P matrix, the weight of each row of the P matrix is depended on the number of logic "one" (i.e. 1) in the row. It is noted that the P matrix is the transpose of H matrix, i.e. P=$H^T$. In addition, the rows of the P matrix are sorted according to row weight (the number of logic 1) in an ascending order. According to this example, the lowest weight of the P matrix is 4. There are 8 rows with the lowest weight, i.e. the number of logic 1 is 4. Moreover, there are 21, 31, 30, and 45 rows with the weights 5, 6, 7, and 8 respectively.

In operation 407, the sorted rows are then formed in groups by their row weights. Accordingly, each group includes rows of a specific weight. For example, the specific weight may be the weights 4, 5, 6, 7, and 8.

In operation 409, the number of rows in the P matrix to be truncated is determined to obtain the truncated P matrix. In this example, the total number of rows of the truncated P matrix is 128.

In operation 411, an x-th group is identified. The front x groups of the sorted rows have a sum of row weights smaller than the number of data bits k by q, where q is smaller than the row weight of the (x+1)-th group. In this example, k is 128. The front x groups are the groups of 8 rows with the weight of 4, 21 rows with the weight of 5, 31 rows with the weight of 6, and 30 rows with the weight of 7. The (x+1)-th group is the rows with the weight of 8. The total number of the rows of the front x groups is 8+21+31+30=90. Thus, q is 38, i.e. 128−90=38.

Subsequently, in operation 413, q rows in the (x+1)-th group are randomly selected to make a sum of row weights of the front x groups and the selected q rows equals k. In this example, 38 (i.e. 38 out of 45) rows with the weight of 8 are picked to form the truncated P matrix with the total rows of 128, i.e. 8+21+31+30+38=128. Subsequently, the remaining rows are truncated in operation 415. The truncated rows include, if any, the (x+2)-th and higher groups, which have more 1's than the front (x+1) groups. The truncated rows also include the rows in the (x+1)-th group except the selected q rows.

In operation 413, an algorithm is performed upon the rows in the (x+1)-th group to choose the q rows in the (x+1)-th group, i.e. 38 out of 45 rows with the weight of 8. To find rows that have minimum weights, an exemplary code, e.g. Python code, of the algorithm may be used in below.

```
Pmat = np.genfromtxt('Sorted_P_Matrix.txt', delimiter = ' ', dtype = int)
weight8 = 45
choose = 38
starting = 90
ind = list(range(weight8))
ind_sh = [x+starting for x in ind]
comb = list(itr.combinations(ind_sh, choose))
num_comb = len(comb)
min = 16*144*143
for i in range(num_comb):
```

```
    HH = Pmat[np.array(comb[i])]
    Htmat = np.concatenate((Pmat[0:starting],HH), axis=0)
    acc = 0
    for j in range(0, starting+choose):
        for k in range(j+1, starting+choose):
            acc = acc + sum(GF_add(Htmat[j], Htmat[k]))
    if acc < min:
        min = acc
        index = comb[i]
        print(min, index) /* print intermediate local min */
# print the combinations that gives the best total weight
print("final", min, index)
```

According to the operations 401-415, the truncated P matrix and the combination matrix with the minimum total number of logic 1 are obtained. According to some embodiments, the combination matrix is the matrix constructed with the pairs of two rows in the truncated P matrix.

Afterwards, logic gates and logic circuits (e.g. the error correction circuit 104) may be designed in accordance with the truncated structure. Since rows in the P matrix (or columns in the H matrix) with a greater number of 1's are truncated, with the truncated P matrix, some logic gates may be eliminated, resulting in a relatively simple circuit structure. Specifically, the truncated P matrix is arranged to perform the operation of "dot" product with the retrieved bit vector to generate the check bits and the syndrome bits, in which the operation of "dot" product is the adding of the multiplies of the corresponding entries of the truncated P matrix and the retrieved bit vector. In the error correction circuit, an operation of adding is carried out by an XOR gate, and an operation of multiply is carried out by an AND gate. Therefore, when an entry of the truncated P matrix is 0, the result of multiplying the entry of the truncated P matrix with an entry of the retrieved bit vector is also 0 (i.e. using the AND gate). When the result of multiplying the two entries is 0, there is no need to perform the operation of adding the "0" in the "dot" product, i.e. the XOR gate can be omitted. On the contrary, when an entry of the truncated P matrix is 1, the operation of an XOR gate is enabled. The more number of logic 1 in the P matrix, the more XOR gates should be used in the error correction circuit 104. Therefore, to minimize the number of XOR gate in the error correction circuit 104, the number of 1's in the P matrix should be minimized. In the truncated P matrix, the number of 1's is minimized by truncating the rows in the P matrix with a greater number of 1's. Accordingly, some logic gates (e.g. some XOR gates) in the error correction circuit 104 may be eliminated, resulting in a relatively simple circuit structure.

Figure 6:
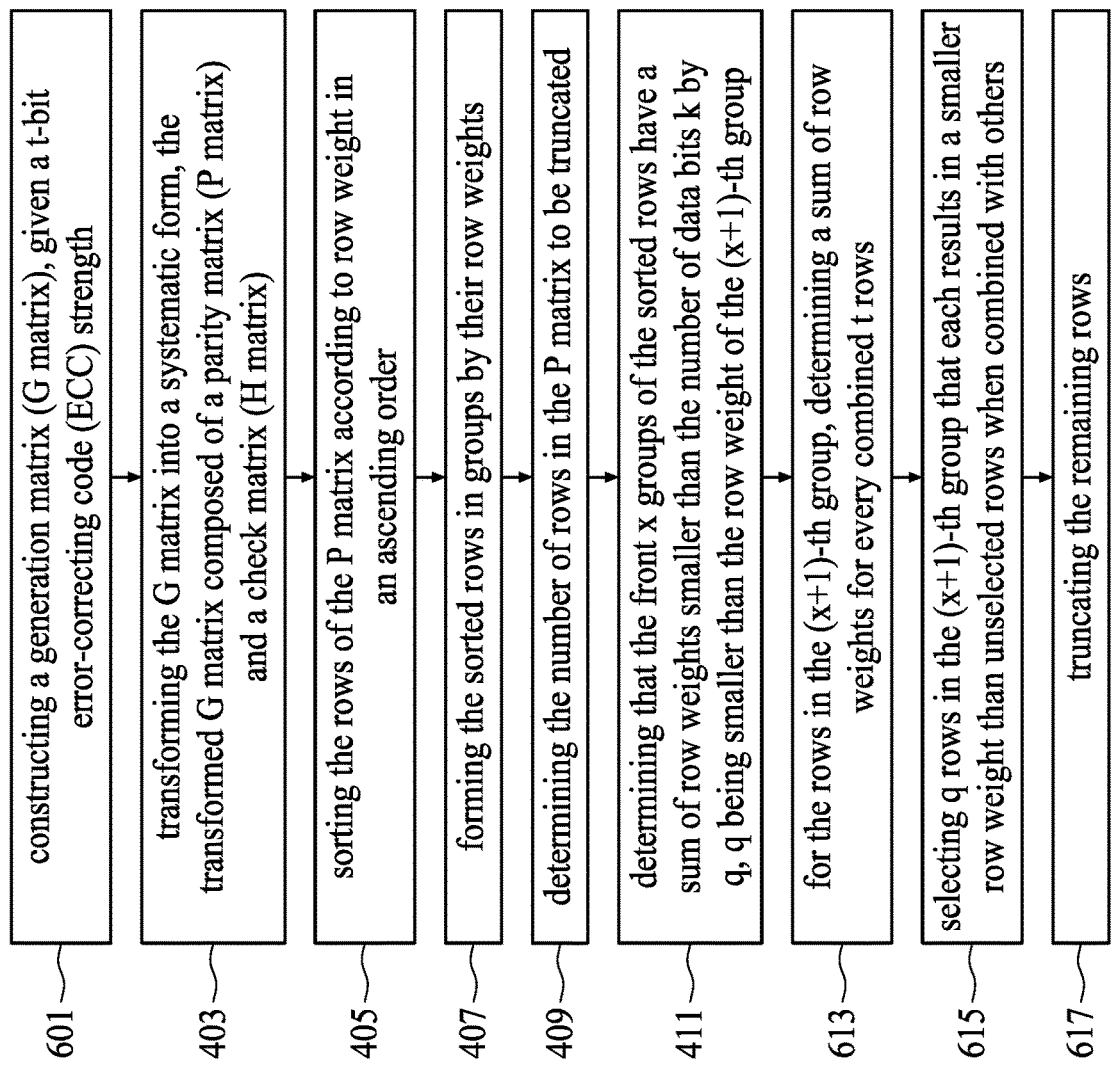
FIG. 6 is a flow diagram showing a method of reducing logic for a memory device with multi-bit error-correcting strength, in accordance with some embodiments.

FIG. 6 is a flow diagram showing a method of reducing logic gates for an error correction circuit in a memory device with multi-bit error-correcting strength, in accordance with some embodiments. The error correction circuit may be the error correction circuit 104 of FIG. 1.

Referring to FIG. 6, in operation 601 a generation matrix (G matrix), given a t-bit error-correcting code (ECC) strength, is constructed, t being greater than one (1).

Operations 403, 405, 407, 409 and 411 are similar to those discussed in FIG. 4. After identifying an x-th group in operation 411, for the rows in the (x+1)-th group, a sum of row weights for every combined t rows is determined in operation 613. The row weight is depended on the number of logic 1 in the row as described above. Taking t equal 2 as an example, every two rows in the P matrix are combined bitwise by a logic "OR" function to determine the sum each of the combined rows.

In operation 615, q rows in the (x+1)-th group that each results in a smaller row weight than unselected rows when combined with others are selected. Subsequently, the remaining rows with higher row weight are truncated in operation 617. The truncated rows include, if any, the (x+2)-th and higher groups, which have more 1's than the front (x+1) groups. According to the operations 601-617, the truncated matrix with the minimum total number of logic 1 are obtained. As described above, the more number of logic 1 in the P matrix, the more XOR gates should be used in the error correction circuit. In the truncated P matrix, the number of 1's is minimized by truncating the rows in the P matrix with a greater number of 1's. Accordingly, some logic gates (e.g. some XOR gates) in the error correction circuit may be eliminated, resulting in a relatively simple circuit structure.

Figure 7:
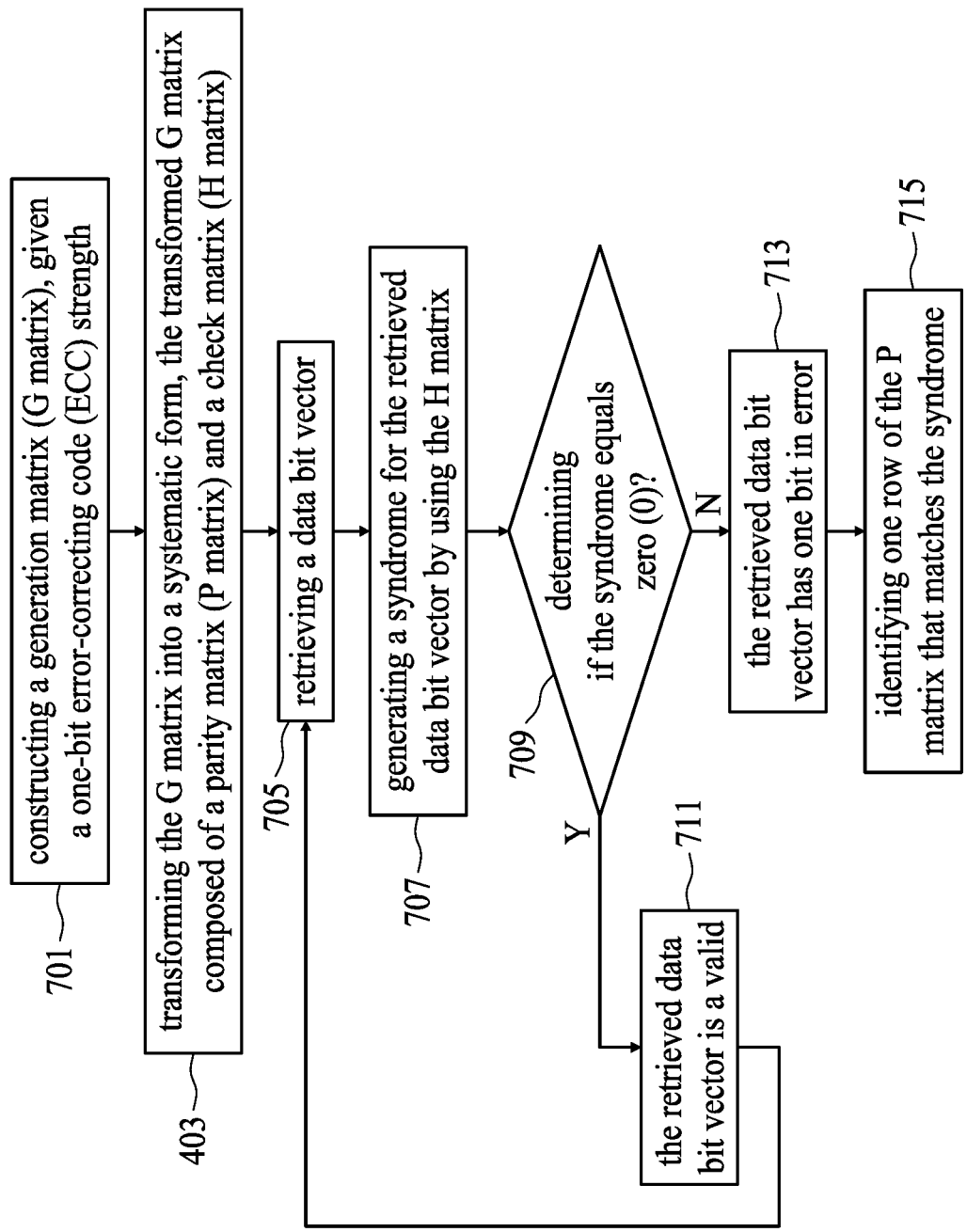
FIG. 7 is a flow diagram showing a method of determining error location in a memory device with one-bit error-correcting strength, in accordance with some embodiments.

FIG. 7 is a flow diagram showing a method of determining error location in a memory device with one-bit error-correcting strength, in accordance with some embodiments. The method may be performed by the error correction circuit 104 of FIG. 1.

In operation 701 a generation matrix (G matrix), given a one-bit error-correcting code (ECC) strength, is constructed.

Referring to FIG. 7, after transforming the G matrix into a systematic form, in operation 705 a data bit vector is retrieved. According to some embodiment, the data bit vector may be the codeword retrieved/read-out from a semiconductor memory (e.g. 102), and the data bit vector may comprise bit errors that need to be corrected.

Next, in operation 707 a syndrome for the retrieved data bit vector is generated by using the H matrix. A syndrome may be used to determine an error of the retrieved data bit vector. As described above, the syndrome is generated by multiplying the retrieved data bit vector with the transpose of the H matrix.

It is determined in operation 709 whether the syndrome vector equals zero. If affirmative, the retrieved data bit vector is determined to be valid in operation 711. Another data bit vector may then be retrieved in operation 705, followed by the syndrome test through operations 707 and 709. If in operation 709 the syndrome is not equal to zero (the syndrome equals one, given the one-bit ECC strength in the present embodiment), it is determined that there is an error in the retrieved data bit vector in operation 713. Subsequently, by comparing against the syndrome vector, one row of the P matrix that matches the syndrome vector is identified and an error bit is determined.

Figure 8:
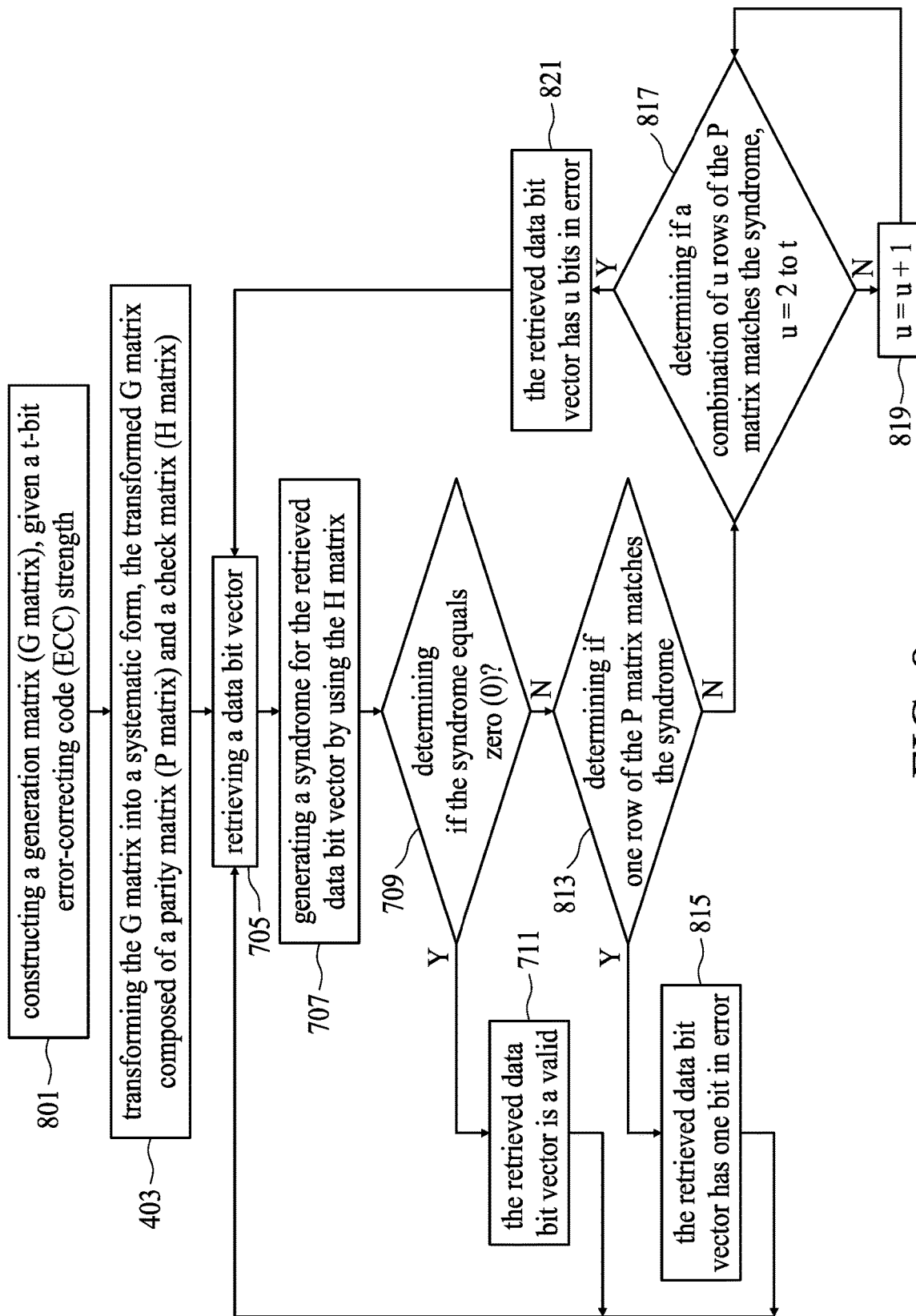
FIG. 8 is a flow diagram showing a method of determining error location in a memory device with multi-bit error-correcting strength, in accordance with some embodiments.

FIG. 8 is a flow diagram showing a method of determining error location in a memory device with multi-bit error-correcting strength, in accordance with some embodiments. The method may be performed by the error correction circuit 104 of FIG. 1.

Referring to FIG. 8, in operation 801 a generation matrix (G matrix), given a t-bit error-correcting code (ECC) strength, is constructed, t being greater than one (1).

Operations 403, 705, 707, 709 and 711 are similar to those discussed in FIG. 7. In operation 709 if it is determined that the syndrome vector is not equal to zero, which means that the retrieved data bit vector has one or more bits in error given the t-bit ECC strength, then in operation 813 it is determined if one row of the P matrix matches the syndrome. If affirmative, it is determined in operation 815 that the retrieved data bit vector has one error bit. Subsequently, by comparing against the syndrome vector, one row of the P matrix that matches the syndrome vector is identified and an error bit is determined.

If in operation 813 it is determined that no single row of the P matrix matches the syndrome, which means that the retrieved data bit vector has two or more bits in error, then in operation 817 it is determined if a combination of two rows of the P matrix matches the syndrome. In an embodiment, the combination is made by a logic exclusive-or "XOR" function. If the combined rows match the syndrome, then in operation 821 it is determined that the retrieved vector has two bits in error, and two error bits associated with the two rows can be determined.

If in operation 817 it is determined that no two rows of the P matrix when combined match the syndrome, then in operation 819 it is determined that the retrieved data bit vector has three or more bits in error. Operations 817 and 819 are repeated until error bit locations are determined given the t-bit ECC strength. As a result, if syndrome equals zero, the retrieved data bit vector is valid and has no bits in error. If syndrome is not equal to zero and one row matches the syndrome, then there is one error bit. If syndrome is not equal to zero and two rows combined match the syndrome, then there are two error bits. Likewise, if syndrome is not equal to zero and t rows combined match the syndrome, then there are t error bits.

Figure 9:
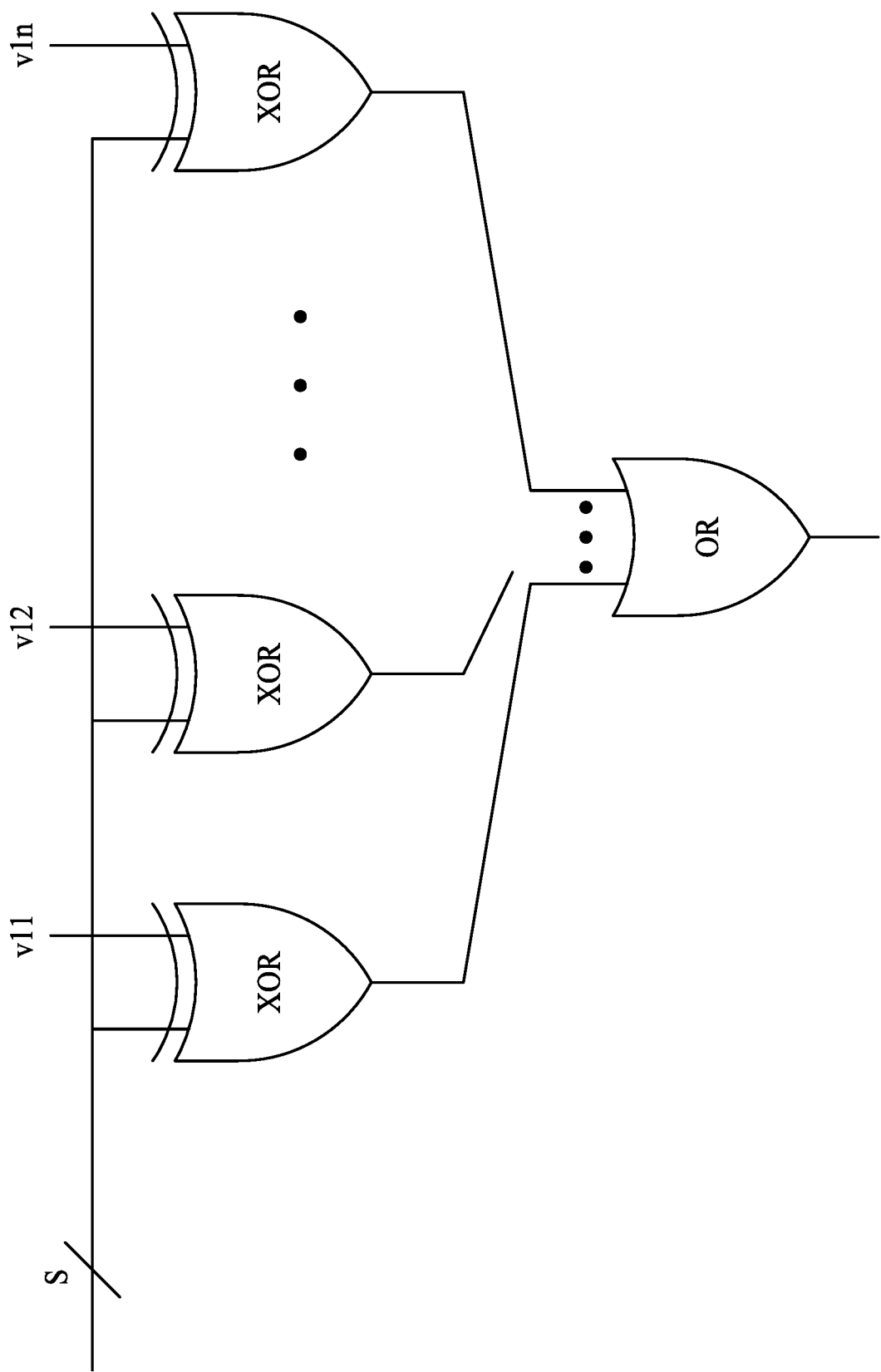
FIG. 9 is a systematic diagram of an exemplary logic circuit for determining error location, in accordance with some embodiments.

FIG. 9 is a systematic diagram of an exemplary logic circuit for determining error location, in accordance with some embodiments.

Referring to FIG. 9, when the syndrome is not equal to zero, the syndrome is compared with the rows of the truncated P matrix (or the columns of the truncated H matrix) to determine an error location of a bit. According to some embodiments, the complexity of the truncated H matrix has been reduced by truncating the columns with relatively large weights. Therefore, the complexity of determining the error location is also reduced. For example, in FIG. 9, a column vector [v11, v12 . . . v1n] of the H matrix is compared against a syndrome S bitwise by using XOR gates, followed by an OR gate to add the outputs from the XOR gates. When the column vector [v11, v12 . . . v1n] of the H matrix matches the syndrome S bitwise, i.e. the output of the OR gate is zero, then the column vector [v11, v12 . . . v1n] is in error, and a bit error is detected. The exemplary logic circuit shown in FIG. 9 is used for detecting one bit in error. To determine t-bit error, more logic gates and wiring are required. As previously discussed, since rows in the columns in the H matrix with a greater number of 1's are truncated, the total column number of the H matrix is reduced. Accordingly, the operations of comparing the truncated H matrix and the syndrome S are greatly reduced, and the resource or logic gates of the decoder may be saved.

According to some embodiments, the error correction circuit 104 may be formed or fabricated by a semiconductor fabricating process. The error correction circuit 104 may be implemented in digital electronic circuitry or in computer hardware, firmware, software, or in combinations of them. The error correction circuit 104 may be supplemented by, or incorporated in, specially-designed application-specific integrated circuits (ASICs) or suitably programmed field programmable gate arrays (FPGAs).

Moreover, apparatus of the embodiment may be implemented in a computer program product tangibly embodied in a machine-readable storage device for execution by a computer processor; and method steps of the embodiment may be performed by a computer processor executing a program to perform functions of the embodiment by operating on input data and generating output. Suitable processors include, by way of example, both general and special purpose microprocessors. Storage devices suitable for tangibly embodying computer program instructions include all forms of non-volatile memory including, but not limited to: semiconductor memory devices such as EPROM, EEPROM, and flash devices.

In some embodiments, the present disclosure provides a method of generating an error correction circuit for correcting an error in a codeword read from a memory. The method comprises: constructing a generation matrix (G matrix) formed of a concatenation of a parity matrix (P matrix) and an identity matrix; determining a number of rows in the P matrix for a truncated P matrix in view of a correcting strength and a number of data bits; selecting a first subset of rows and a second subset of rows in the P matrix, wherein a first sum of row weights of each row in the first subset of rows is equal to or less than a second sum of row weights of each row in the second subset of rows; generating the truncated P matrix by keeping the first subset of rows of the P matrix so as to minimize a number of logic gate operations; and forming an error correction circuit in at least one of a digital electronic circuit, an application-specific integrated circuit, a field programmable gate array, and a computer circuit implemented as at least one of hardware, firmware and software according to the truncated P matrix.

In some embodiments, the present disclosure also provides a method of generating an error correction circuit for correcting an error in a codeword read from a memory. The method comprises: constructing a generation matrix (G matrix) comprising a parity matrix (P matrix) and arranged in a systematic form; sorting rows of the P matrix into groups of different row weights in an ascending order of the row weights; determining a number of rows in the P matrix to be truncated; determining that a row number of first x groups of the sorted rows is less than a number of data bits k by a number q; forming a truncated P matrix from rows of the first x groups and q rows of the (x+1) group; and forming an error correction circuit in at least one of a digital electronic circuit, an application-specific integrated circuit, a field programmable gate array, and a computer circuit implemented as at least one of hardware, firmware and software according to the truncated P matrix.

In some embodiments, the present disclosure provides a method of generating an error correction circuit for correcting an error in a codeword read from a memory. The method comprises: constructing a generation matrix (G matrix) having a t-bit error-correcting strength, the G matrix comprising a parity matrix (P matrix) and arranged in a systematic form; generating a syndrome for a retrieved data bit vector by using a check matrix (H matrix) based on the P matrix; combining u rows of the P matrix, u being a natural number not greater than t so as to truncate the P matrix; determining the error when the combined u rows match the syndrome; and generating an error correction circuit including a truncated P matrix through truncating rows of the P matrix for correcting the error of the codeword according to the syndrome, wherein a number of logic 1's in the truncated P matrix is minimized in response to truncating the P matrix. The error correction circuit is generated in at least one of a digital electronic circuit, an application-specific integrated circuit, a field programmable gate array, and a computer circuit implemented as at least one of hardware, firmware and software.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of generating an error correction circuit for correcting an error in a codeword read from a memory, comprising:

constructing a generation matrix (G matrix) formed of a concatenation of a parity matrix (P matrix) and a first identity matrix;

determining a number of rows in the P matrix to form a truncated P matrix in view of a correcting strength and a number of data bits;

selecting a first subset of rows and a second subset of rows in the P matrix, wherein a first sum of row weights of each row in the first subset of rows is equal to or less than a second sum of row weights of each row in the second subset of rows;

generating the truncated P matrix by keeping the first subset of rows of the P matrix so as to minimize a number of logic gate operations; and forming an error correction circuit in at least one of a digital electronic circuit, an application-specific integrated circuit, a field programmable gate array, and a computer circuit implemented as at least one of hardware, firmware and software according to the truncated P matrix.

2. The method according to claim 1, further comprising detecting the error using a check matrix (H matrix) formed from a transpose of the P matrix concatenated with a second identity matrix.

3. The method according to claim 1, wherein the selecting of the first subset of rows and the second subset of rows comprises:

sorting rows of the P matrix according row weights of the rows of the P matrix in an ascending order; and determining that a row number of first x groups of the sorted rows is less than a number of data bits k by a number q, q being smaller than a row weight of the (x+1)-th group.

4. The method according to claim 3, wherein the correcting strength is one bit, further comprising:

randomly selecting q rows in the (x+1)-th group to make a sum of rows of the first x groups and the selected q rows equal to k; and truncating remaining rows of the P matrix to generate the truncated P matrix.

5. The method according to claim 3, wherein the correcting strength is t bits, t being a natural number greater than one, further comprising:

combining every t rows in the (x+1)-th group; and determining a sum of row weights for every combined t rows.

6. The method according to claim 5, wherein the step of combining every t rows further comprises:

combining every t rows bit wise by a logic OR gate.

7. The method according to claim 5, further comprising:
selecting q rows in the (x+1)-th group that each results in a smaller row weight than unselected rows when combined with others; and
truncating remaining rows of the P matrix.

8. The method according to claim 7, further comprising:
determining a number of logic gates based on the P matrix after truncation.

9. A method of generating an error correction circuit for correcting an error in a codeword read from a memory, comprising:
constructing a generation matrix (G matrix) comprising a parity matrix (P matrix) and arranged in a systematic form;
sorting rows of the P matrix into groups of different row weights in an ascending order of the row weights;
determining a number of rows in the P matrix to be truncated;
determining that a row number of first x groups of the sorted rows is less than a number of data bits k by a number q;
forming a truncated P matrix from rows of the first x groups and q rows of the (x+1) group; and
forming an error correction circuit in at least one of a digital electronic circuit, an application-specific integrated circuit, a field programmable gate array, and a computer circuit implemented as at least one of hardware, firmware and software according to the truncated P matrix.

10. The method according to claim 9, further comprising detecting the error using a check matrix (H matrix) formed from a transpose of the P matrix concatenated with an identity matrix.

11. The method according to claim 9, wherein a row number of the truncated P matrix is determined based on a correcting strength and a number of data bits of the error correction circuit.

12. The method according to claim 9, wherein the forming of the truncated P matrix further comprises:
truncating remaining rows of the P matrix.

13. The method according to claim 12 further comprising:
determining a number of logic gates based on the P matrix after truncation.

14. The method according to claim 9, wherein determining a sum of row weights for every combined t rows further comprises:
combining every t rows in the (x+1)-th group; and
determining a sum of row weights for every combined t rows.

15. The method according to claim 14, wherein combining every t rows further comprises:
combining every t rows bitwise by a logic OR gate.

16. A method of generating an error correction circuit for correcting an error in a codeword read from a memory, comprising:
constructing a generation matrix (G matrix) having a t-bit error-correcting strength, the G matrix comprising a parity matrix (P matrix) and arranged in a systematic form;
generating a syndrome for a retrieved data bit vector by using a check matrix (H matrix) based on the P matrix;
combining u rows of the P matrix, u being a natural number not greater than t so as to truncate the P matrix;
determining the error when the combined u rows match the syndrome; and
generating an error correction circuit comprising a truncated P matrix through truncating rows of the P matrix for correcting the error of the codeword according to the syndrome, wherein a number of logic 1's in the truncated P matrix is minimized in response to truncating the P matrix,
wherein the error correction circuit is generated in at least one of a digital electronic circuit, an application-specific integrated circuit, a field programmable gate array, and a computer circuit implemented as at least one of hardware, firmware and software.

17. The method according to claim 16, wherein combining u rows further comprises:
combining every u rows bitwise by a logic exclusive-or "XOR" gate.

18. The method according to claim 16, after constructing the G matrix, further comprising:
sorting rows of the P matrix according to row weight in an ascending order; and
forming the sorted rows in groups by their row weights.

19. The method according to claim 18 further comprising:
determining a number of rows in the P matrix to be truncated; and
determining that first x groups of the sorted rows have a sum of row weights smaller than a number of data bits k by a number q, q being smaller than the row weight of the (x+1)-th group.

20. The method according to claim 19 further comprising:
for the rows in the (x+1)-th group, determining a sum of row weights for every combined t rows; and
selecting q rows in the (x+1)-th group that each results in a smaller row weight than unselected rows when combined with others.

* * * * *